(12) United States Patent
Kim et al.

(10) Patent No.: US 12,196,797 B2
(45) Date of Patent: Jan. 14, 2025

(54) RADIO WAVE DEVICE TESTING SYSTEM HAVING IMPROVED SIGNAL TRANSMISSION PATH

(71) Applicant: National Radio Research Agency, Naju-si (KR)

(72) Inventors: Kang Wook Kim, Gwangju (KR); Soon Soo Oh, Gwangju (KR); Young Bae Jung, Daejeon (KR); Jong Hyuk Lim, Icheon-si (KR); Jung Kuy Park, Yeoju-si (KR); Sam Young Jung, Icheon-si (KR)

(73) Assignee: National Radio Research Agency, Naju-si (KR)

( * ) Notice: Subject to any disclaimer, the term of this patent is extended or adjusted under 35 U.S.C. 154(b) by 120 days.

(21) Appl. No.: 17/952,215

(22) Filed: Sep. 24, 2022

(65) Prior Publication Data
US 2023/0400493 A1     Dec. 14, 2023

(30) Foreign Application Priority Data

Jun. 13, 2022 (KR) .................. 10-2022-0071431
Jun. 13, 2022 (KR) .................. 10-2022-0071438

(51) Int. Cl.
    *G01R 29/10*      (2006.01)
    *G01R 29/08*      (2006.01)
    *G01S 1/02*      (2010.01)

(52) U.S. Cl.
CPC ....... *G01R 29/105* (2013.01); *G01R 29/0821* (2013.01); *G01R 29/0871* (2013.01); *G01R 29/0878* (2013.01); *G01S 1/022* (2013.01)

(58) Field of Classification Search
CPC .............. G01R 29/105; G01R 29/0821; G01R 29/0878; G01R 29/0871; G01S 1/022; H04B 17/101
(Continued)

(56) References Cited

U.S. PATENT DOCUMENTS

2010/0271262 A1* 10/2010 Eibert .................... G01R 29/10
    342/360
2018/0351631 A1* 12/2018 Hamabe ............. G01R 29/0892
(Continued)

FOREIGN PATENT DOCUMENTS

KR        1020200093759 A      8/2020

OTHER PUBLICATIONS

KR 20200093759 Machine Translation, Aug. 6, 2020 (Year: 2020).*
EP 3276362 Machine Translation, Jan. 31, 2018 (Year: 2018).*

*Primary Examiner* — Raul J Rios Russo
(74) *Attorney, Agent, or Firm* — You & IP, LLC

(57) ABSTRACT

Disclosed is a radio wave device test system, comprising a fixed part configured to fix a radio wave device; a positioner system configured to control a rotation of the radio wave device by controlling the fixed part; an arch structure whose central point is located at a position where the radio wave device is located; a plurality of probes disposed to be spaced apart from one another at fixed intervals in the arch structure, and configured to receive a radio frequency (RF) signal from the raid wave device; and a plurality of receiving modules located at the plurality of probes, respectively, and configured to transform the RF signal into in-phase/quadrature (I/Q) data by carrying out digital transformation for the RF signal and to detect information on amplitude and a phase from the I/Q data.

14 Claims, 8 Drawing Sheets

(58) Field of Classification Search
USPC .................................................. 324/754.31
See application file for complete search history.

(56) References Cited

U.S. PATENT DOCUMENTS

| | | | |
|---|---|---|---|
| 2021/0148958 A1* | 5/2021 | Abadie | G01R 29/0871 |
| 2021/0148959 A1* | 5/2021 | Rowell | H04B 17/382 |
| 2021/0247431 A1* | 8/2021 | Maruo | G01R 29/0871 |
| 2023/0254050 A1* | 8/2023 | Don | H04B 17/12 |
| | | | 343/702 |

* cited by examiner

RADIO WAVE DEVICE TESTING SYSTEM HAVING IMPROVED SIGNAL TRANSMISSION PATH

CROSS-REFERENCE TO RELATED APPLICATION

This application claims priority to Korean Patent Application No. 10-2022-0071438, filed on Jun. 13, 2022, and Korean Patent Application No. 10-2022-0071431, filed on Jun. 13, 2022 in the Korean Intellectual Property Office, the entire contents of which are hereby incorporated by reference.

BACKGROUND OF THE INVENTION

Field of the Invention

The present invention relates to a radio wave device test system. More particularly, the present invention relates a system and a method that are capable of measuring radiation performance of a radio wave device at high speed.

Description of the Related Arts

As there was a sharp rise in demand for radio wave resources such as an increase in wireless traffic, large-scaled data transmission and so on, necessity to develop a technology capable of measuring performance of a radio wave device such as an antenna and so on at high speed within rapid time has increased.

In particular, in the recent communications circumstance of 5G and so on, antennas based on new technologies have their respective properties of carrying out multi-beamforming on the basis of a plurality of antenna elements.

However, with respect to this antenna measurement (test), for a method of measuring signal radiation performance of the antennas while moving one or some probes as shown in the existing method are necessarily required considerable time and resources.

FIGS. 1A, 1B and 1C are views for explaining one example of a conventional antenna measurement method.

FIGS. 1A, 1B and 1C describe an antenna performance measurement method using as a near-field antenna measurement method that has been recently widely used for antenna measurement in a high frequency band.

As illustrated in FIGS. 1A, 1B and 1C, the near-field antenna measurement method, which has been encouraged in IEEE std 1720, may be largely divided into three antenna measurement methods, such as a planar type near-field antenna measurement method, a cylindrical type near-field antenna measurement method, and a spherical type near-field antenna measurement method according to each shape of a surface measured.

In the planar type near-field antenna measurement method, near-field measurement of a two-dimensional plane in a frontward area of an antenna under test (AUT) is carried out. However, a radiation pattern, which can be measured by the planar type near-field antenna measurement method, is disadvantageous in that only a part in the frontward area of the antenna can be obtained.

The cylindrical type near-field antenna measurement method is a measurement method of carrying out measurement at the position of a cylindrical surface centering around the AUT. With respect to a plane horizontal to the ground, three-dimensional measurement in all directions can be performed, and with respect to a plane perpendicular to the ground, it is possible to perform measurement only as much as a driving distance of a probe, and although a radiation pattern in a comparative wide scope compared with that in planar measurement facilities can be obtained, it is impossible to carry out measurement in all directions.

The spherical type near-field antenna measurement method is a measurement method of carrying out measurement on a spherical surface at a position apart from the AUT as much as a fixed distance. It is possible to carry out measurement in all points of spherical coordinates, and a radiation pattern can be three-dimensionally measured in all the directions. Furthermore, a near distance electric field calculated through the measurement may be transformed into a long distance electric field using a calculation process based on Fourier transform, thereby obtaining a long distance electric field of the AUT. Due to this reason, the technique of beam foaming belonging into the characteristic of a multiplex arrangement antenna which is an antenna to be used in a current millimeter wave band is determined to be the best appropriate measurement method to perform measurement.

These antenna performance measurement methods may be selectively used according to directivity or radiation patterns of the antennas.

In a conventional antenna performance measurement method, radiation performance (a radiation pattern, intensity of a signal, and so on) is measured in such a manner as to receive a signal outputted from an antenna under test (AUT) while moving probes intended for receiving the signal outputted from the AUT along predetermined grid points, and to analyze it. Furthermore, in case of the cylindrical type antenna measurement method and the spherical type antenna measurement method, in addition to the movement of the probes, the measurement may be carried out in such a manner as to rotate the AUT, and to receive the signal per the grid points corresponding to a whole sphere by performing installation as needed.

However, with respect to the conventional method, it is problematic in that the considerable time and resources as described above are necessarily required, and because it is possible to carry out a test for only an antenna corresponding to one frequency band, in order to carry out a test for an antenna corresponding to another frequency band, the test should be carried out through a separate measurement system which can measure said another frequency band.

Furthermore, an output may become different according to each antenna, and at this time, it is problematic in that it is not easy to change test circumstances to be adaptable, and in case of an antenna (machinery) in dependently (voluntarily) radiating a signal, because it is required to measure a reference phase, it is also problematic in that it is difficult to effectively dispose and utilize reference probes for measurement.

PRIOR ART DOCUMENT

Patent Document (Patent Document 0001) Korean Laid-Open Patent Publication No. 1020200093759 entitled "METHOD OF MEASURING ANTENNA PERFORMANCE, AND CHAMBER THEREFOR"

SUMMARY OF THE INVENTION

The present invention has been devised for solving the problems of the conventional art, and provides a radio wave device test system which can measure radiation performance of a radio wave device with respect to a plurality of frequency bands at a high speed.

According to one aspect of the present invention, a radio wave device test system may comprise: a fixed part configured to fix a radio wave device; a positioner system configured to control a rotation of the radio wave device by controlling the fixed part; an arch structure whose central point is in a position where the radio wave device is located; a plurality of probes disposed to be spaced apart from one another at fixed intervals in the arch structure, and configured to receive a radio frequency (RF) signal from the raid wave device; and a plurality of receiving modules located at the plurality of probes, respectively, and configured to transform the RF signal into in-phase/quadrature (I/Q) data by carrying out digital transformation of the RF signal and to detect information on amplitude and a phase from the I/Q data.

The radio wave device test system may further comprise a control device configured to receive the information on the amplitude and the phase from the plurality of receiving modules, and to measure radiation performance of the radio wave device based on the information on the amplitude and the phase.

The control device may comprise: a mechanical control unit configured to control a beam direction of the probes; and a main control unit configured to calculate a radiation property of the radio wave device.

The positioner system may comprise: an azimuth positioner configured to rotate the radio wave device in an azimuth direction; and a goniometer configured to rotate the radio wave device in an elevation direction.

Each of the receiving modules may comprises: a downward transformation part configured to transform the RF signal inputted from the probes into an intermediate frequency (IF) signal; and a signal processing part configured to transform the IF signal into the I/Q data, and to detect the information on the amplitude and the phase. Each of the receiving modules comprises a digital communications part configured to receive the information on the amplitude and the phase from one receiving module adjacent thereto, and to transmit it to another adjacent receiving module or the control device.

Each probe may have a circular horn shape.

The plurality of probes may be grouped to correspond to a plurality of channels, respectively, and the plurality of channels may correspond to frequency bands which are different from one another, respectively.

The arch structure may comprise a radio wave absorption body attached to an outer side thereof.

According to one exemplary embodiment of the present invention, a plurality of probes are disposed in an arch structure so that radiation performance of the radio wave device with respect to the plurality of frequency bands can be measured at a high speed.

Furthermore, according to some exemplary embodiments of the present invention, the plurality of receiving probes in an arrangement type are installed so that simultaneous measurement can be performed, and because the receiving modules are attached to the probes, respectively, and the received RF signal is transmitted to the control device after being transformed into digital data, no noise occurring due to a connection cable between each receiving module and the control device comes into the RF signal.

BRIEF DESCRIPTION OF THE DRAWINGS

The brief description of each drawing is provided in order to help more sufficient understanding of the drawings referred to in the detailed description of the present invention.

DETAILED DESCRIPTION OF THE INVENTION

Figure 1A:
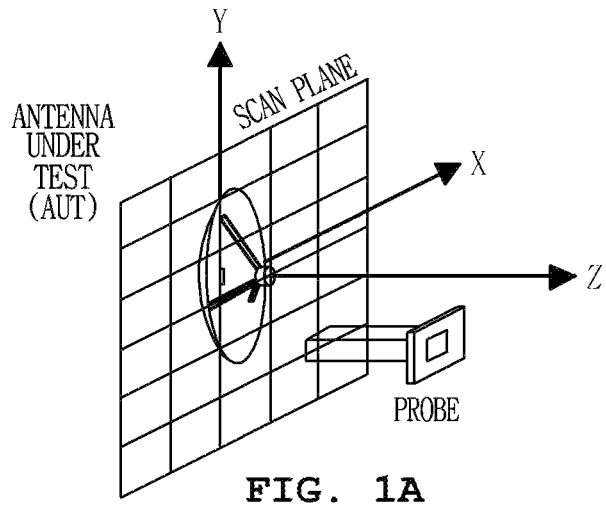
FIGS. 1A, 1B and 1C are for explaining a conventional antenna measurement method.
Figure 1B:
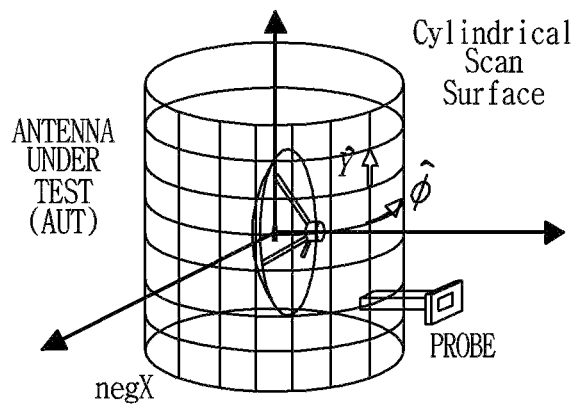
Figure 1C:
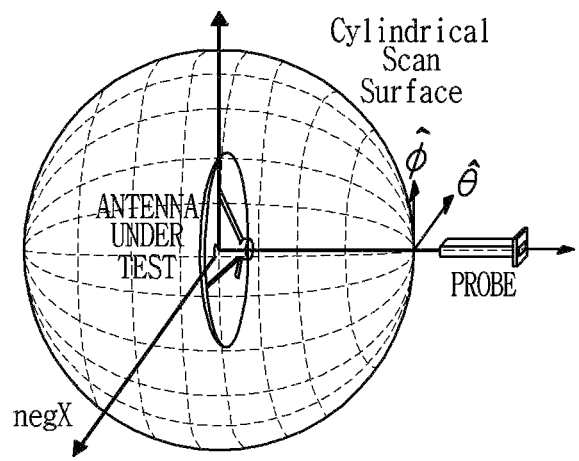

Hereinafter, the present invention will be described in detail.

The present invention may have various modifications and several kinds of exemplary embodiments, and specific exemplary embodiments will be exemplified in the drawings and will be also described in detail in the detailed description. However, it should not be construed as limiting the present invention to specifically embodied forms, but should be understood as including all the modifications, equivalents, or alternations included in the technical idea and scope of the present invention. In the description of the present invention, when the detailed description of well-known relevant arts may make the gist of the present invention unclear, the detailed description thereof will be omitted.

Although the terms, such as a first term, a second term, and so on may be used in the description of various constituent elements, the constituent elements should not be limited to the terms. The terms are used only with the intention of distinguishing one constituent element from another constituent element.

The terms used in the present specification are only intended for describing specific exemplary embodiments and are not intended to limit the present invention. The singular forms are intended to include the plural forms as well, unless the context clearly indicates otherwise.

In the present specification, the terms, such as "comprise" "have" and so on are intended to show that there are features, numerals, steps, operations, constituent elements, component parts, or a combination thereof described herein, and should not be construed as previously excluding the existence or addition of one or more other features, numerals, steps, operations, constituent elements, component parts, or combination thereof.

Furthermore, in the present specification, what one constituent element transmits data to another constituent element means that said one constituent element may transmit the data directly to said another constituent element, and that said one constituent element may transmit the data to said another constituent element via at least one further constituent element. On the contrary, what one constituent element "directly transmits" data to another constituent element means that the data is transmitted from said one constituent element to said another constituent element without transmission via any another constituent element.

Hereinafter, the present invention is described in detail based on exemplary embodiments of the present invention with reference to the accompanying drawings. The same reference numerals as those presented in each drawing show the same constituent elements.

Figure 2:
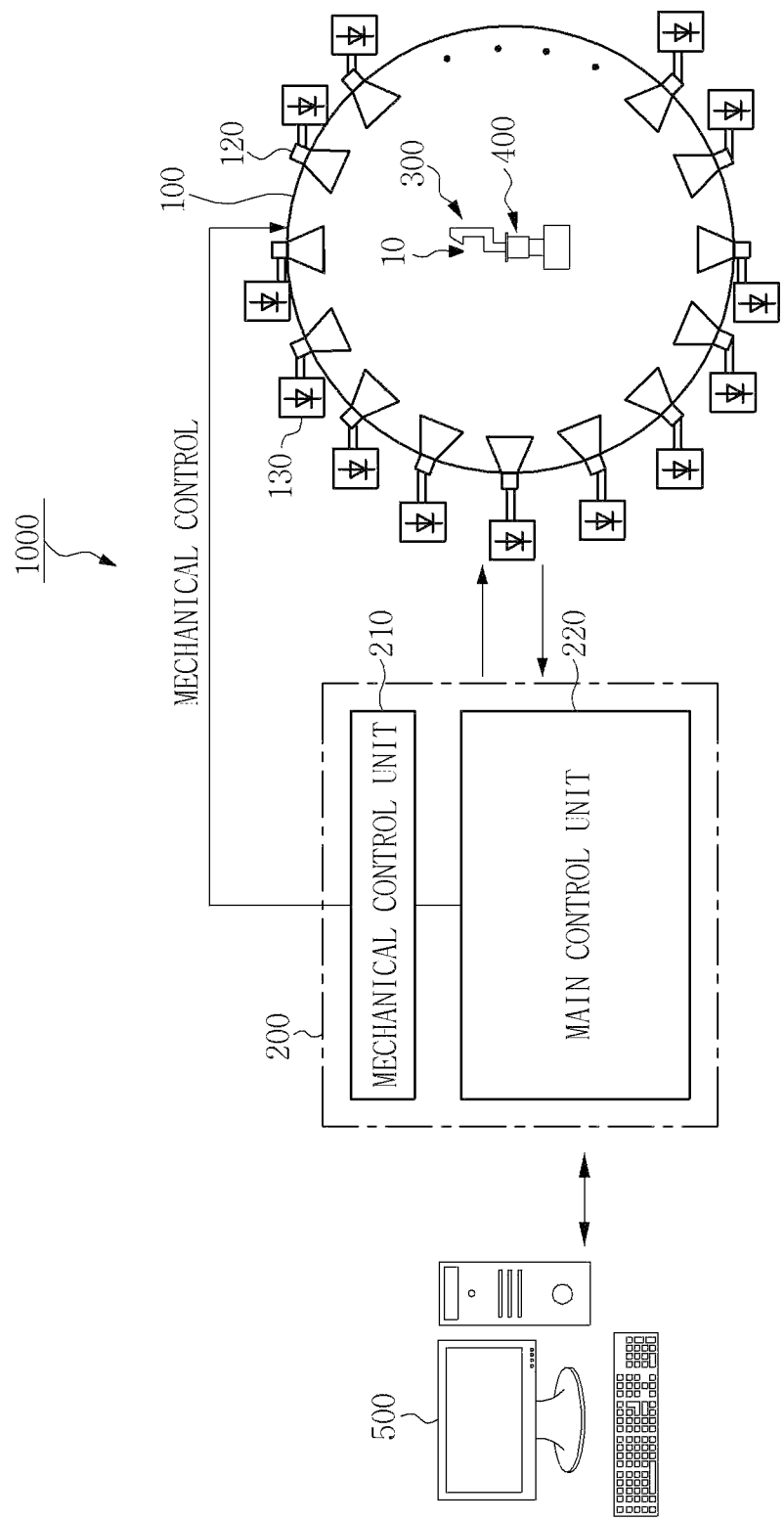
FIG. 2 is a view for showing a schematic structure of a radio wave device test system according to one exemplary embodiment of the present invention.

FIG. 2 is a view for showing a schematic structure of a radio wave device test system according to one exemplary embodiment of the present invention.

Referring to FIG. 2, the radio wave device test system 1000 comprises a measurement device and a control device.

The measurement device may receive a signal radiated from a radio wave device. The radio wave device may be a device of radiating a radio wave, for example, an antenna under test (AUT). The measurement device receives a signal outputted from the radio wave device, and detects information on intensity (amplitude) and a phase of the received signal, thereby transmitting it to the control device.

The control device may receive the information on the amplitude and the phase of the received signal from the measurement device, and may calculate an antenna profit, an antenna radiation pattern, and total radiated power of the radio wave device on the basis of the information on the amplitude and the phase of the received signal.

Specifically, the measurement device of the radio wave device test system 1000 may comprises: an arch structure 100; a plurality of probes 120; a fixed part 300; and a positioner system 400.

The measurement device may be embodied within a predetermined anechoic chamber.

A large number of radio wave absorption bodies (for example, pyramid type radio wave absorption bodies) are installed on an inside wall and the bottom of the anechoic chamber so that no signal radiated from the radio wave device can be reflected from the inside of the anechoic chamber. The radio wave absorption bodies function to reduce a reflection electric field of an inner portion of the anechoic chamber upon measurement. Because reflexibility of each radio wave absorption body becomes different according to each frequency, the radio wave absorption bodies each having appropriate spec may be selected according to a frequency used in the anechoic chamber.

Meanwhile, the measurement device comprises the plurality of probes 120, wherein the plurality probes are installed on the arch structure 100. Each of the probes 120 is an antenna having a radiant pattern. Each of the probes 120 is designed so as to receive a signal of a predetermined frequency band.

Figure 3A:
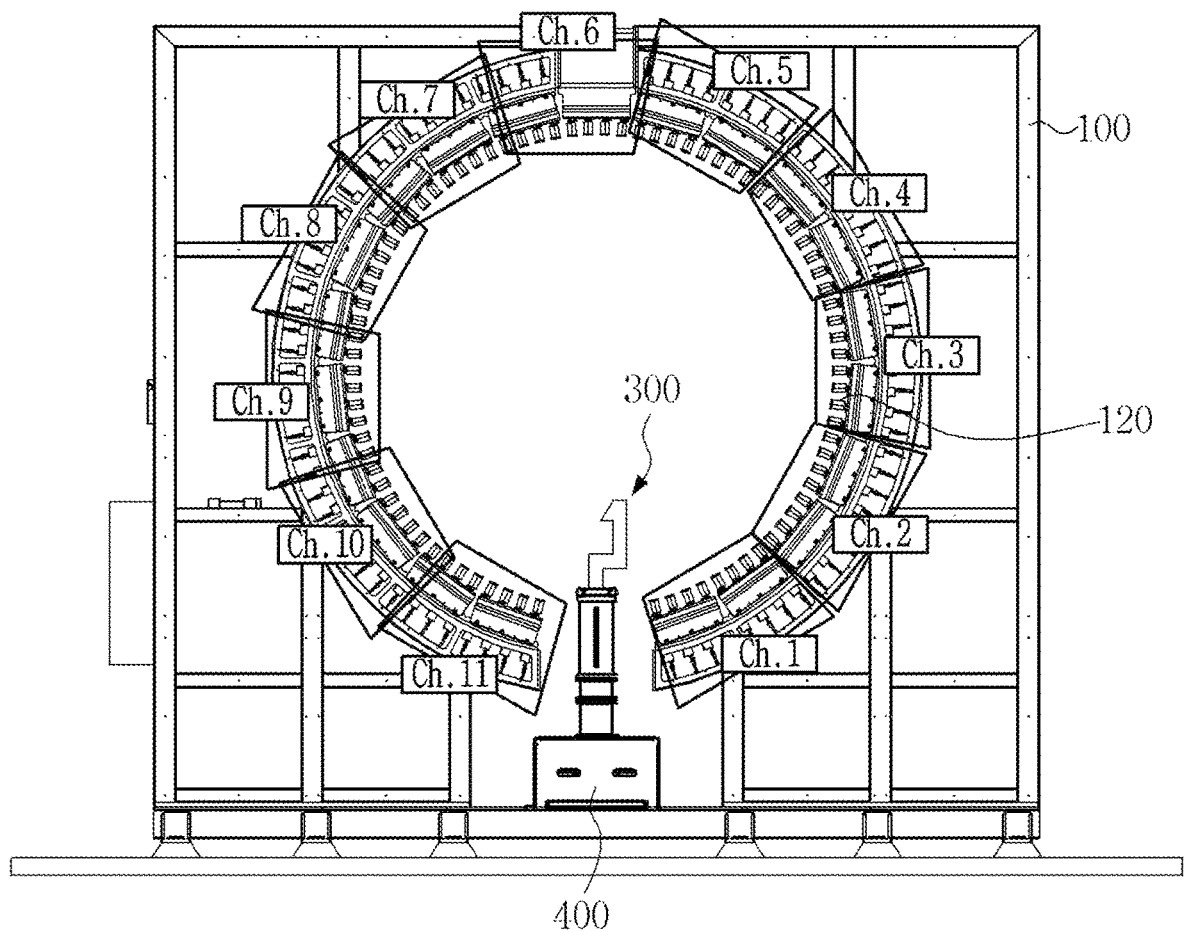
FIG. 3A and FIG. 3B are views showing a front view and a perspective view of an arch structure according to one exemplary embodiment of the present invention.
Figure 3B:
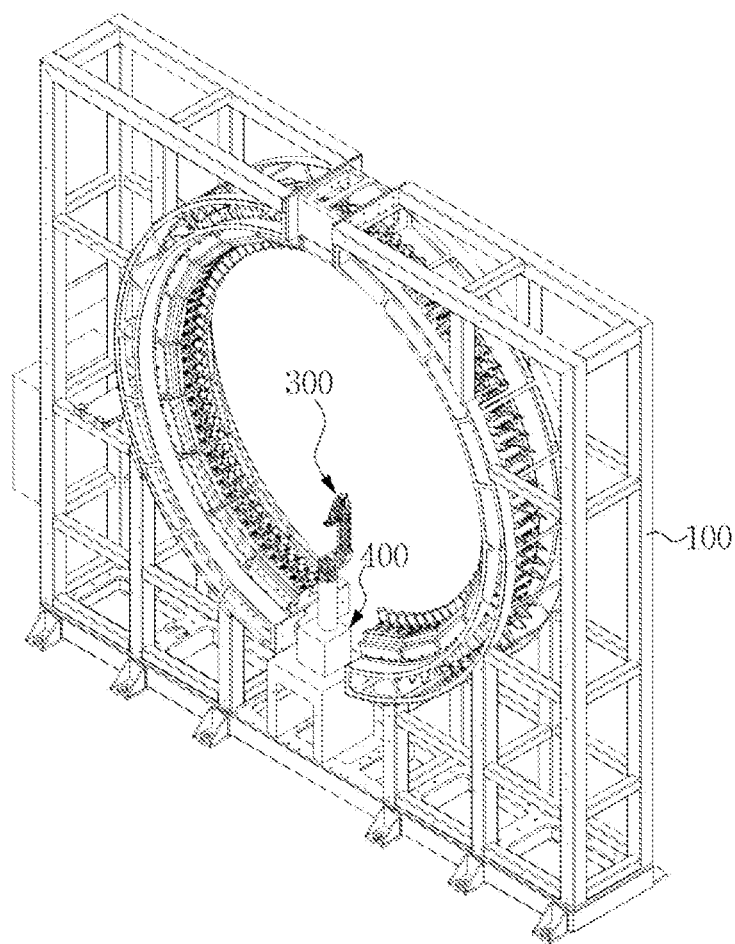

FIG. 3A and FIG. 3B are views showing a front view and a perspective view of the arch structure according to one exemplary embodiment of the present invention.

Referring to FIGS. 3A and 3B, the arch structure 100 is an arch-shaped frame structure, and the plurality of probes may be installed on the arch structure 100 at regular angle intervals. The plurality of probes may be grouped to correspond to a plurality of channels. The plurality of channels may correspond to their respective frequency bands which are different from one another.

Figure 4:
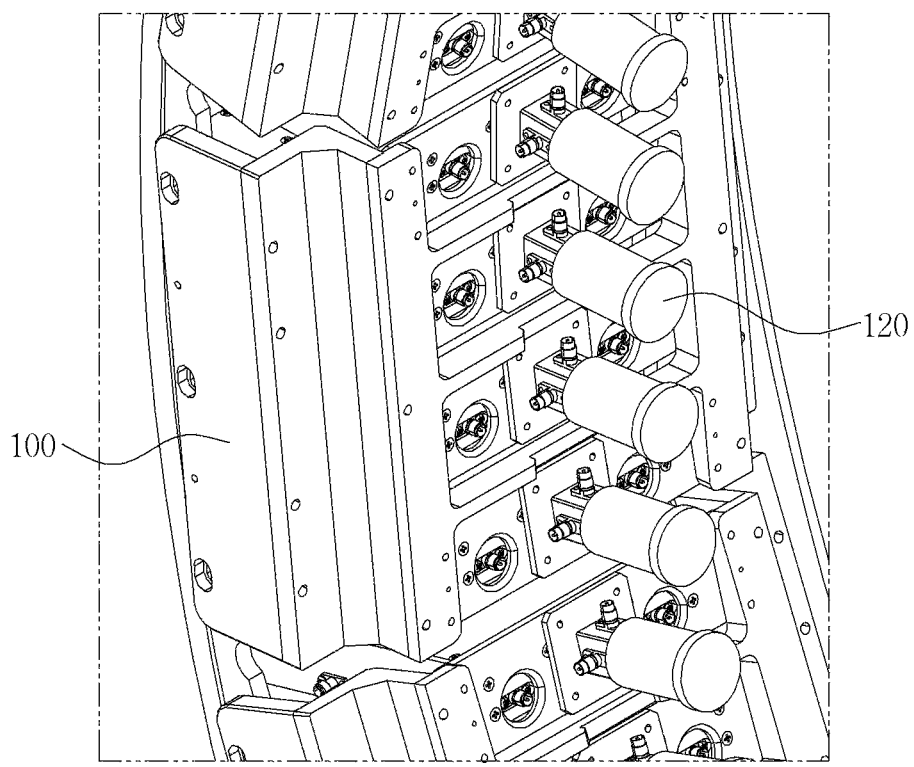
FIG. 4 is a view showing enlargement of a part of the arch structure to which probes are mounted according to one exemplary embodiment of the present invention.

For example, the plurality of probes 120 are mounted to the arch structure 100 at intervals shown in FIG. 4.

For example, 84 probes may be mounted to the arch structure 100 to be disposed in an arch shape.

The plurality of probes 120 installed as above may simultaneously receive a signal radiated from the radio wave device by control of the control device 200.

FIG. 4 is a show showing enlargement of a part of the arch structure to which the probes are mounted according to one exemplary embodiment of the present invention.

As illustrated in FIG. 4, the plurality of probes 120 have been mounted to the arch structure 100. Each position of the probes may be fixed. Furthermore, the positions where the probes are mounted to the arch structure 100 may show a state of being disposed at predetermined intervals.

According to another exemplary embodiment, the respective positions of the probes may be embodied to be variable. For example, fixed grooves are formed in a widthwise direction of an arch frame of the arch structure 100, and the probes may slide along the grooves in a state of being mounted to the grooves. In this case, the positions of the probes combined with the arch structure 100 may be changed.

A radio wave absorption body may be attached the outside of the arch structure 100.

Meanwhile, in the exemplary embodiments of the present invention, although the case in which the arch structure 100 includes one arch is exemplarily described for convenience of the description, two or more arches may be included. In this case, two or more arches of the arch structure 100 may be disposed so as to form a sphere space at the inside. Furthermore, each of the arches furnished in the arch structure 100 may correspond to a circumference of the sphere space which the arch structure 100 forms, and each of the arches may be furnished to correspond to any one frequency band. What each of the arches corresponds to any one frequency bad may mean that any one arch is used in a test for a specific frequency band, and that another arch is used in a test for another frequency band. A raid wave absorption body is also installed on an outside wall of the arch structure 100 so that it can be embodied to control the reflection of a signal outputted from an antenna under test 10

The radio wave device 10 may be located at the inside of the arch space which the arch structure forms, and may radiate a radio frequency (RF) signal.

Specifically, it is mounted or installed by the fixed part 300 of the positioner system 400. The positioner system 400 may be a device of controlling a movement of the fixed part 300 according to control of the control device 200.

The positioner system 400 may cause the radio wave device 10 to be located at an accurate angle position. To do so, the positioner system 400 may include an azimuth positioner configured to rotate the radio wave device 10 in an azimuth direction, and a goniometer configured to rotate the radio wave device 10 in an elevation direction.

The radio wave device 10 may be mounted to the fixed part 300, and the fixed part 300 may be rotated by the positioner system 400.

If the fixed part 300 is embodied so as to fix the radio wave device 10, it will be enough to function. A radio wave absorption body may be attached to the outside of the fixed part 300. According to another exemplary embodiment, the fixed part 300 may be formed of a material whose reflectivity to a radio wave is low.

The movement of the fixed part 300 may be controlled by the positioner system 400.

The positioner system 400 may cause to radio wave device 10 to rotate in the azimuth direction, or to rotate in the elevation direction by controlling the movement of the fixed part 300.

The positioner system 400 may carry out a test while rotating the radio wave device 10 in the azimuth angle direction under control of the control unit, and in case that a sampling distance in sphere is wide, the positioner system 400 rotates the antenna under test 10 in the elevation direction at a fixed angle, and rotates the antenna under test 10 in the azimuth angle direction after tilting the antenna under test 10, thereby bringing about an effect of obtaining an inputted signal from positions each having a narrower sampling distance than that in a space.

Meanwhile, although it is not illustrated, a walk way for the movement path of a person of the anechoic chamber may be installed. It is preferable that the walk way 20 is also formed with a radio wave absorption body.

The radio frequency (RF) signal radiated from the radio wave device 10 is received by the probes disposed in the arch structure 100.

Each probe 120 may transmit the RF signal corresponding to two kinds of polarization (H-pol and V-pol) to the receiving module 130. Specifically, each probe may have a double polarization property of vertical polarization and horizontal polarization.

The RF signal received by each probe 120 may be transmitted to the receiving module 130 located at the corresponding probe as described below.

Figure 5:
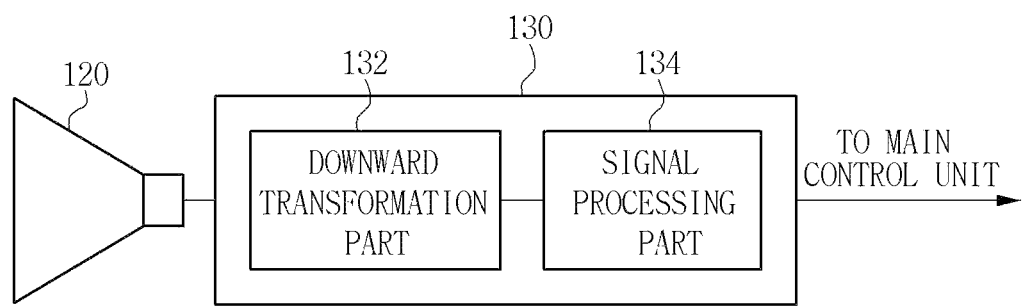
FIG. 5 illustrates a block diagram of a receiving module according to one exemplary embodiment of the present invention.

FIG. 5 illustrates a block diagram of the receiving module according to one exemplary embodiment of the present invention.

The receiving module 130 is located at the corresponding probe 120. That is, the probe 120 is disposed to be just adjacent to the receiving module 130. That is, the probe 120 may be connected to the receiving module 130 without a separate connection cable.

The receiving module 130 may be configured so as to receive a vertically polarized signal and a horizontally polarized signal received by the probe 120 are received by performing switching therebetween.

When the receiving module 130 receives the RF signal from the probe 120, the RF signal is transformed into an intermediate frequency (IF) signal, and as digital transformation concerning the IF signal is carried out, the IF signal is transformed into in-phase/quadrature (I/Q) data. The receiving module 130 may detect information on amplitude and a phase from the I/Q data, and may transmit the detected amplitude and phase information to the outside of the anechoic chamber, for example, the main control unit 220.

The receiving module 130 may transmit e detected amplitude and phase information to another receiving module adjacent thereto without sending it to the main control unit directly, and the adjacent receiving module may make the information transmitted to the main control unit 220.

To do so, the receiving module 130 comprises: a downward transformation part 132 configured to transform the RF signal inputted from the probe into an intermediate frequency (IF) signal; and a signal processing part 134 configured to transform the IF signal into the I/Q data and to detect the amplitude and phase information from the I/Q data.

Thus, because the RF signal received by the probe 120 is not transmitted to the main control unit 220 for performance measurement of the radio wave device, no noise due to a connection cable comes in the RF signal of the receiving module 130.

Like this, according to the exemplary embodiment of the present invention, because the receiving module 130 is connected to the probe 120 without a connection cable, the RF signal received by the probe 120 may be transmitted in a state in which no noise due to a connection cable comes in the RF signal of the receiving module 130. Furthermore, because the receiving module 130 transforms the received RF signal into a digital signal, for example, I/Q data, and transmits it to the control device 200, a noise occurring due to transmission of an analogue signal may be prevented from coming in. Furthermore, according to the exemplary embodiment of the present invention, it is not required to furnish a position between the radio wave device 10 and the control device 200 with a low noise amplifier.

Meanwhile, the control device 200 may receive the amplitude and phase information, of the RF signal and may calculate radiation performance of the radio wave device 10 based on the amplitude and phase information of the RF signal. That is, the control device 200 may derive the radiation performance (for example, a radiation pattern, intensity, and so on) of the radio wave device 10 therefrom.

Because algorism for deriving the radiation performance of the radio wave device 10 from the amplitude and phase information of the RF signal has been widely known, the detailed description thereof is omitted in the present specification.

In this case, the control device 200 may carry out communication with an administrator terminal 500. Although FIG. 2 illustrates one example in which the control device 200 and the administrator terminal 500 are embodied as separate devices, an ordinary skilled expert in the technical field of the present invention could easily induce that the administrator terminal 500 and the control device 200 may be embodied as one physical device as needed.

Meanwhile, the control device 200 may control the other constitutions furnished in the radio wave device test system 1000.

For this, the control device 200 may comprise a processor and a storage medium for realizing functions defined in the present specification. The processor may mean an arithmetic unit capable of executing a fixed program (software code). The processor may be named various terms, such as a vendor mobile processor, a micro processor, a central processing unit (CPU), single processor, a multi processor, and so on.

An ordinary skilled expert in the technical field of the present invention could easily induce that data processing required for realizing technical ideas of the present invention (e.g., control of the other constitutions, the induction of radiation performance, and so on) may be carried out as the program is driven.

The storage medium may mean a device in which a program for realizing the technical ideas of the present invention is saved and/or installed. According to each embodied example, the storage medium may be divided into a plurality of physical devices which are different from one another. According to each embodied example, a part of the storage medium may exist in the inside of the processor. The storage medium may be embodied to be a hard disk, a solid state disk (SSD), an optical disk, a random access memory (RAM), and/or various kinds of memory media according to each embodied example, and may be embodied in a form of being attachable and detachable to the control device 200 as needed.

The control device 200 may be embodied as a data processing device such as a computer, a notebook, a server, and so on without being limited thereto, and may be also embodied as a data processing device (for example, a mobile terminal and so on) capable of processing data which execute the program.

Furthermore, an ordinary skilled expert in the technical field of the present invention could easily induce that the control device 200 may be furnished with the processor, the storage medium, various peripherals (for example, an input and output device, a display device, an audio device, and so on) furnished in the control device 200, and a communications interface (for example, a communications bus and so on) intended for connecting these devices.

The control device 200 may comprise: a mechanical control unit 210 configured to control a position of the probe 120; and a main control unit 220 configured to calculate radiation property of the radio wave device.

The mechanical control unit 210 may control directivity of the probe. For example, the mechanical control unit 210 may control a direction of the probe 120 via a goniometer (not drawn).

The main control unit 220 may feed the RF signal to at least one feeding points 121a or 121b of the probe 120, thereby carrying out controlling so that the probe receives the RF, signal.

Furthermore, the receiving module 130 may detect information on amplitude and a phase of the RF signal radiated from the radio wave device, and may transmit the detected amplitude and phase information to the outside of the anechoic chamber, for example, to the main control unit 220.

Meanwhile, the probe 120 is designed so as to have a diameter not exceeding 35 mm and a length not exceeding 70 mm under the consideration of its arrangement on the arch structure 100 and connectivity with the receiving module 130. The probe 120 is connected to the receiving module 130 via a connector (not drawn). With respect to the connector used, a connector of 2.92 mm (K) capable of transmitting a signal which reaches 40 GHz may be used. The probe 120 is designed so that an operation frequency band becomes 24.0 GHz to 29.5 GHz, a port matching becomes less than −7 dB, and a port isolation becomes less than −20 dB.

A 3-dB beamwidth was decided to be 28°, and in order to secure beam symmetry, a gain difference of less than 1 dB should appear within an area of the 3-dB beamwidth of a main beam. A cross polarization isolation is designed to be −20 dB.

Requirements for the probe are summarized as shown in Table 1.

TABLE 1

| external appearance | shape | circular horn (conical), 2-port dual polarization |
|---|---|---|
| external appearance | size | 35 mm (diameter) × 70 mm (length) |
| external appearance | connector | 2.92 mm (K) |
| | operation frequency band | 24.0–29.5 GHz |
| S-parameter | port matching (S11) | <−10 dB |
| S-parameter | port isolation (S21) | <−20 dB |

TABLE 1-continued

| radiation pattern | 3-dB beamwidth | 28° (±2.5°) |
|---|---|---|
| radiation pattern | beam symmetry | gain difference in beamwidth of a main beam of 1 dB or below |
| radiation pattern | cross polarization | <−15 dB |

The basis for calculation of the beam width of 3-dB presented previously is described with reference to FIG. 5.

Figure 6:
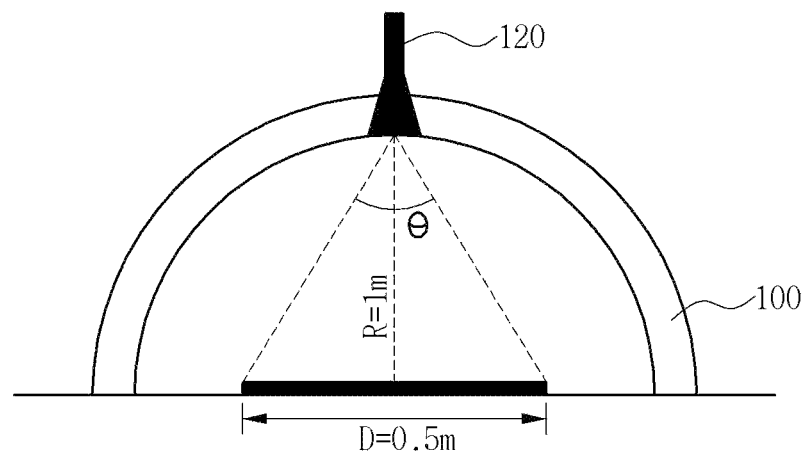
FIG. 6 is a view for explaining a basis from which a beam width is derived, and a calculation for a diameter of the aperture of each probe according to one exemplary embodiment of the present invention.

FIG. 6 is a view for explaining the basis for derivation of the beam width and calculation for a diameter of the aperture of the probe.

As illustrated in FIG. 6, on the assumption that the probe 120 is located to look at a plane on which the radio wave device 10 is put from the front, an isosceles triangle consisting of the center of the aperture t of the probe and two ends of the radio wave device may be drawn.

The beam width of the probe 120 was decided by calculating an angle with a trigonometrical function, wherein the angle causes the center of the aperture to be the vertex of the isosceles triangle. When the radio wave device 10 has a size of 0.5 m, and an arch radius of 1 m, the beam width of the probe is about 28.1 degrees, and this is summarized as shown in following Mathematical Formula 1.

$$\theta = 2\tan^{-1}\left(\frac{D/2}{R}\right) \approx 28.1[deg] \quad \text{[Mathematical Formula 1]}$$

Where the radio wave device 10 has a size D of 0.5 m, and an arch radius R of 1 m.

Because the beam width of the probe 120 was calculated, a size of the aperture which should be designed may be also calculated. A transverse mode of electromagnetic radiation means a specific electromagnetic field pattern of radiation shown from a plane perpendicular (i.e., transverse) to a radio wave direction of radiation, and in a round-shaped wave guide, because the transverse magnetic (TM) 11 mode is a main mode, a wavelength in the air is calculated according to a calculation formula, and when its value is substituted in the calculation of the wavelength, the size of the aperture should become about 22.2 mm as shown in following Mathematical Formula 2.

Thus, a radius d of the aperture of the probe 120 may be calculated as shown in following Mathematical Formula 2.

$$\lambda = \frac{c}{f} = \frac{3 \times 10^8}{28 \times 10^9} \approx 10.7[mm] \quad \text{[Mathematical Formula 2]}$$

$$d = \frac{58.4\lambda}{beamwidth[deg]} \approx 22.24[mm]$$

In said Mathematical Formula 2, c represents the velocity of light, f represents a receiving frequency, and λ represents a wavelength. Furthermore, d represents a radius of the aperture of the probe.

A power source is supplied in such a manner as to make a hole in a side surface of the round-shaped wave guide, and to insert a connector into the hole. After the round-shaped wave guide having a sufficient length is maintained, a diameter of the section is linearly changed and enlarged to reach the diameter of the aperture calculated previously.

According to the transmission mode of the round-shaped wave guide, cutoff frequency is decided according to the diameter of the wave guide. The cutoff frequency means the minimize frequency which causes electromagnetic energy to operate within the wave guide, and a calculation formula thereof is the same as shown in following Mathematical Formula 3.

$$(f_c)_{mn} = \frac{x_{mn}c_0}{\pi d} \qquad \text{[Mathematical Formula 3]}$$

In said formula, mn represents a mode, d represents a diameter of the wave guide, and c0 means the velocity of light (3×108 m/s) in a vacuum state. xmn, constants according to each mode represents the geun of a differential equation, Jmn'(xmn)=0, of Bessel function, and a transverse electric (TE) mode and a transverse magnetic (TM) mode have been known as shown below.

TABLE 2

Constant xmn related with the cutoff frequency in the TE mode

|  | m = 0 | m = 1 | m = 2 | m = 3 | m = 4 |
|---|---|---|---|---|---|
| n = 1 | 3.8318 | 1.8412 | 3.0542 | 4.2012 | 5.3175 |
| n = 2 | 7.0156 | 5.3315 | 6.7062 | 8.0153 | 9.2824 |
| n = 3 | 10.1735 | 8.5363 | 9.9695 | 11.3459 | 12.6819 |
| n = 4 | 13.3237 | 11.7060 | 13.1704 | 14.5859 | 15.9641 |
| n = 5 | 16.4706 | 14.8636 | 16.3475 | 17.7888 | 19.1960 |

TABLE 3

Constant xmn related with the cutoff frequency in the TM mode

|  | m = 0 | m = 1 | m = 2 | m = 3 | m = 4 |
|---|---|---|---|---|---|
| n = 1 | 2.4909 | 3.8318 | 5.1357 | 6.3802 | 7.5884 |
| n = 2 | 5.5201 | 7.1056 | 8.4173 | 9.7610 | 11.0647 |
| n = 3 | 8.6537 | 10.7135 | 11.6199 | 13.0152 | 14.3726 |
| n = 4 | 11.7915 | 13.3237 | 14.7960 | 16.2235 | 17.6160 |
| n = 5 | 14.9309 | 16.4706 | 17.9598 | 19.4094 | 20.8269 |

As can be seen from Table 2 and Table 3, a main mode of the round-shaped wave guide is the TE11 mode in which cutoff frequency is most low. The diameter of the wave guide which operates in a required frequency band (24 GHz to 29.5 GHz) of the probe is decided using said Mathematical Formula 3. Representatively, some values of the diameter and the cutoff frequency of each mode are calculated as shown below.

TABLE 4

Cutoff frequency according to each mode concerning the diameter of the wave guide

| Diameter of the wave guide | Cutoff frequency [GHz] | | | |
|---|---|---|---|---|
| [mm] | TE11 | TM01 | TE21 | TE01 |
| 7.5 | 23.34 | 31.72 | 38.89 | 48.79 |
| 8.0 | 21.98 | 29.73 | 36.46 | 45.74 |
| 8.5 | 20.68 | 27.98 | 34.43 | 43.05 |

In view of the TE11 mode, it can, be found that when the wave guide has a diameter of 7.5 mm or more, a required frequency band is included. However, if the diameter of the wave guide becomes 8.5 mm, the TM01 mode as well as the TE11 mode may be formed. In this case, because two modes operate simultaneously, the distribution of an electromagnetic field within the wave guide, and the performance of a horn antenna may be distorted. Accordingly, in order to consider only the TE11 mode, because a cutoff frequency of the TM01 mode should be higher than the required frequency band, the wave guide should be designed on the basis of the diameter of 7.8 ram under consideration of an error in production, and so on.

Meanwhile, the probe may have a quad-ridged structure in order to satisfy a cross polarization of −20 dB.

Figures 7A, 7B:
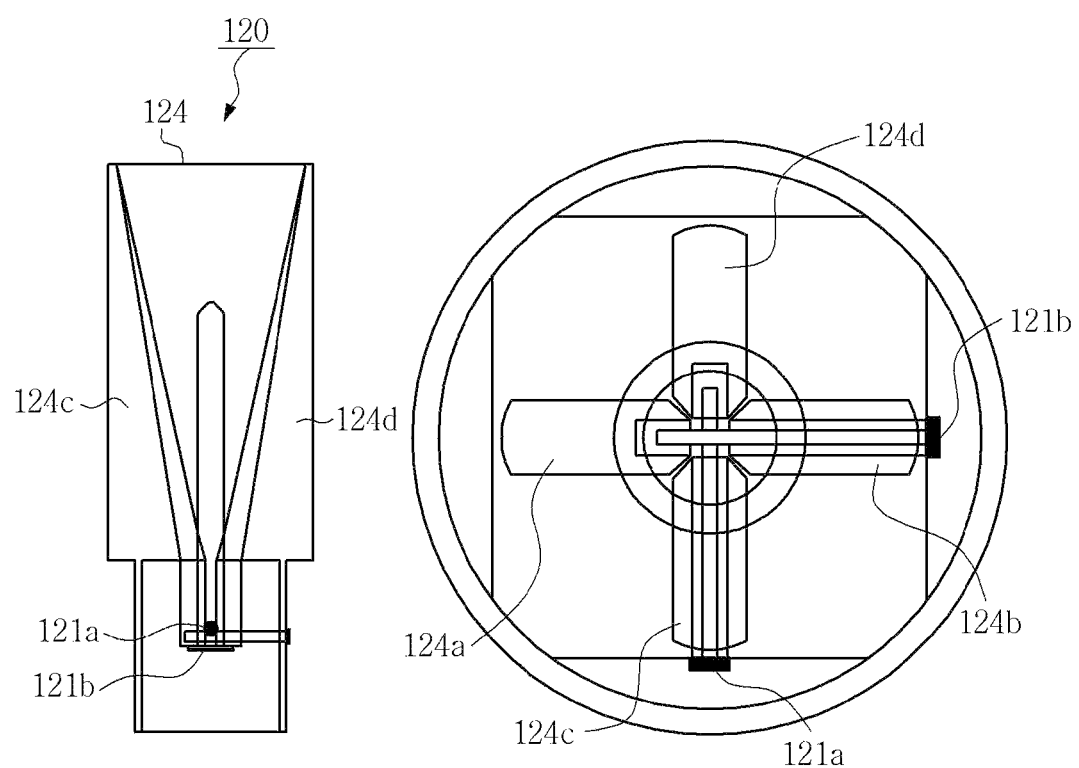
FIGS. 7A and 7B, respectively, illustrate a top view and a cross-sectional view of each probe having a quad-ridged structure according to one exemplary embodiment of the present invention.
Figures 8A, 8B, 8C:
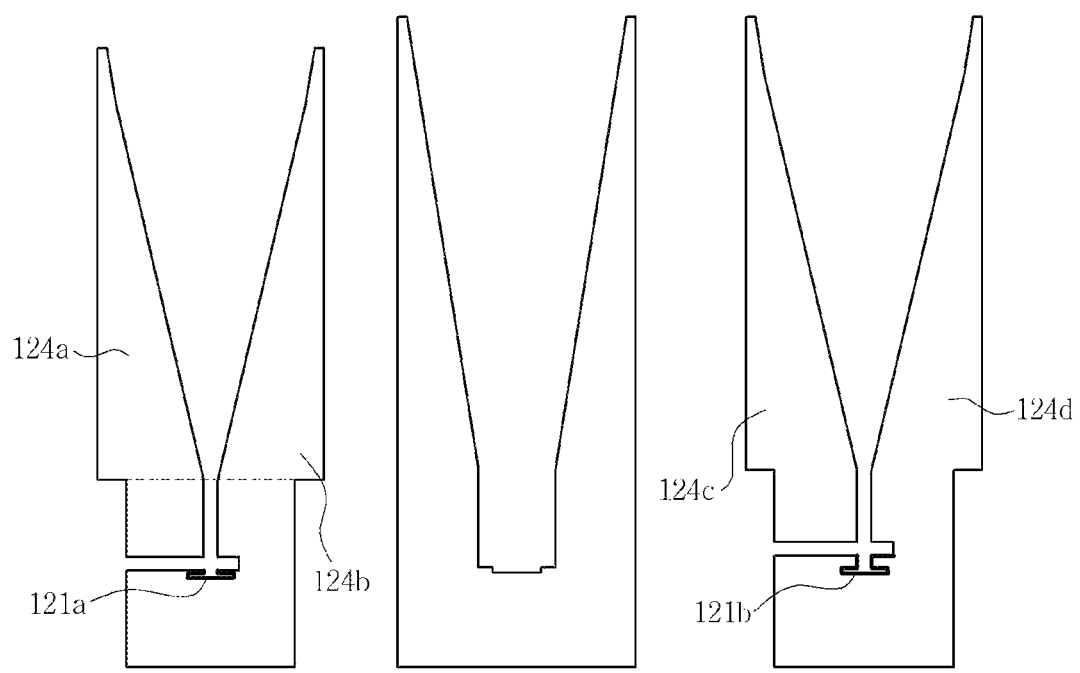
FIGS. 8A, 8B and 8C illustrate cross-sectional views showing each state in which the probe shown in FIGS. 7A and 7B are cut at 0°, 45°, and 90°.

FIGS. 7A and 7B, respectively, illustrate a top view and a cross-sectional view of the probe having a quad-ridged structure according to one exemplary embodiment of the present invention, and FIGS. 8A, 8B and 8C illustrate sections resulting from cutting the probe shown in FIGS. 7A and 7B at 0°, 45°, and 90°.

Referring to FIGS. 7A and 7B and FIGS. 8A, 8B and 8C, the probe 120 comprises a main body in which a wave guide whose section is in a round shape is formed. The wave guide comprises an aperture which causes a beam width to increase in an elevation direction. The wave guide comprises two pairs of ridges which are formed in pairs to cross each other in a cross shape from an inside surface of the aperture. The ridges may be designed to have an exponential tapered curve. Four ridges are configured to make two pairs, each of which includes two ridges facing each other.

According to the present exemplary embodiment illustrated in FIG. 6, the probe is designed to extend linearly in consideration of the unit cost of production.

The probe 120 comprises feeding points 121A and 121B for feeding. Furthermore, the probe 120 comprises a first conductor connected to a first pair of ridges of said two pairs of ridges, and a second conductor connected to a second pair of ridges of said two pairs of ridges.

The feeding points 121A and 121B are connected to the first conductor and the second conductor, respectively. Feeding may be carried out via the feeing points 121A and 121B.

Two conductors extending from the feeding points 121A and 121B are disposed to cross each other, and the tip part of each conductor is located at a groove 125 which extends by Passing through a center of the main body of the probe. Thus, coupling due to radiation occurring at the tip parts of the conductors may reduce.

Specifically, it is mounted or installed by the fixed part 300 of the positioner system 400. The positioner system 400 may be a device intended for controlling a movement of the fixed part 300 according to control of the control device 200.

The positioner system 400 may cause the radio wave device 10 to be located at a position where an accurate angle is realized. For this, the positioner system 400 may comprise an azimuth positioner configured to rotate the radio wave device in an azimuth direction, and a goniometer configured to move the radio wave device 10 in an elevation direction.

The radio wave device 10 is mounted by the predetermined fixed part 300. The fixed part 300 may be rotated by the positioner system 400.

If the fixed part 300 is embodied so as to fix the radio wave device 10, it will be sufficient. A radio wave absorption body may be attached to the outside of the fixed part 300. According to another exemplary embodiment, the fixed part 300 may be formed of a material whose reflectivity to a radio wave is low.

The movement of the fixed part 300 may be controlled by the positioner system 400.

As described below, the positioner system 400 may rotate the radio wave device 10 in the azimuth direction or the elevation direction by controlling the movement of the fixed part 300.

The positioner system 400 may carry out a test while rotating the radio wave device 10 in the azimuth direction under control of the control unit, and in case that a sampling distance in sphere is wide, it may be effective to obtain an input signal from positions, where a distance between the samples narrower than in a space is realized, by rotating the radio wave device 10 in the azimuth direction after causing the radio wave device 10 to tilt by rotating the radio wave device 10, namely, an antenna under test 10 at a fixed angle in the elevation direction via the positioner 300.

Meanwhile, although it is not illustrated, a walkway for a Person's movement path of the anechoic chamber may be installed. It is preferable that the walkway 20 is also formed with a radio wave absorption body.

The RF signal radiated by the radio wave device 10 is received by the probe disposed in the arch structure 100.

Each of the probes 120 may transmit the RE signal corresponding to two polarizations (horizontal polarization and vertical polarization) to the receiving module 130. Specifically, each probe may have a double polarization property of the vertical polarization and horizontal polarization.

The RF signal received by each probe 120 may be transmitted to the receiving module 130 located at the corresponding probe as described below.

The receiving module 130 is located at the corresponding probe 120. That is, the probe 120 is disposed to be just adjacent to the receiving module 130. That is, the probe 120 may be connected to the receiving module 130 without a separate connection cable.

The receiving module 130 may be configured so as to receive a vertically polarized signal and a horizontally polarized signal received via the probe 120 by performing switching therebetween.

When receiving the RF signal from the probe 120, the receiving module 130 transforms the RF signal into an IF signal, and the IF signal into I/Q (quadrature-phase) data for digital transformation. The receiving module 130 may detect information on amplitude and a phase from I/Q (quadrature-phase) data, and may transmit the detected amplitude and phase information to an outer part of the anechoic chamber, for example, to the main control unit 220.

As described above, according to the exemplary embodiment of the present invention, because the receiving module 130 is rightly connected to the probe 120, the RF signal received by the probe 120 may be transmitted to the receiving module 130 without the inflow of a noise occurring due to a connection cable into the RF signal. Furthermore, because the receiving module 130 transforms the RF signal into a digital signal and then transmits it to the control device 200, the inflow of a noise occurring due to the transmission of an analogue signal can be prevented. Furthermore, according to the exemplary embodiment of the present invention, there is no need to furnish a position between the radio wave device 10 and the control unit 200 with a low noise amplifier.

The scope of the present invention appears through the claims described below rather than the detailed description, and it should be construed that all the modifications or altered forms derived from the meanings and scope of the claims, and their equivalent concepts are included in the scope of the present invention.

What is claimed is:

1. A radio wave device test system, comprising:
   a fixed part configured to fix a radio wave device;
   a positioner system configured to control a rotation of the radio wave device by controlling the fixed part;
   an arch structure whose central point is located at a position where the radio wave device is located;
   a plurality of probes disposed to be spaced apart from one another at fixed intervals in the arch structure, and configured to receive a radio frequency (RF) signal from the radio wave device; and
   a plurality of receiving modules located at the plurality of probes, respectively, and configured to transform the RF signal into in-phase/quadrature (I/Q) data by carrying out digital transformation for the RF signal and to detect information on amplitude and a phase from the I/Q data,
   wherein each of the probes comprises:
      a main body in which a wave guide whose section has a circular shape is formed, the wave guide including an aperture whose beam width increases in an elevation direction;
      two pairs of ridges formed to make the pairs and to cross in a cross on an inside surface of the aperture;
      a first conductor connected to a first pair of ridges of said two pairs of ridges;
      a second conductor connected to a second pair of ridges of said two pairs of ridges; and
      feeding points connected to the first conductor and the second conductor.

2. The system of claim 1, further comprising a control device configured to receive the amplitude and phase information from the plurality of receiving modules, and to measure radiation performance of the radio wave device based on the amplitude and phase information.

3. The system of claim 2, wherein the control device is further configured to control a beam direction of the probes and calculate a radiation property of the radio wave device.

4. The system of claim 1, wherein the positioner system comprises:
   an azimuth positioner configured to rotate the radio wave device in an azimuth direction; and
   a goniometer configured to rotate the radio wave device in an elevation direction.

5. The system of claim 1, wherein each of the receiving modules is further configured to transform the RF signal inputted from the probes into an intermediate frequency (IF) signal, transform the IF signal into the I/Q data, and detect the amplitude and phase information from the I/Q data.

6. The system of claim 5, wherein each of the receiving modules comprises a digital communications part configured to receive the amplitude and phase information from one adjacent receiving module, and to transmit it to another adjacent receiving module or the control device.

7. The system of claim 5, wherein each of the receiving modules transmits the detected amplitude and phase information to one receiving module adjacent thereto, and said one adjacent receiving module transmits it to another adjacent receiving module or the main control unit.

8. The system of claim 1, wherein each of the probes has a circular horn shape.

9. The system of claim 1, wherein the plurality of probes are grouped to correspond to a plurality of channels, respectively, and the plurality of channels correspond to frequency bands which are different from one another, respectively.

10. The system of claim 1, wherein the arch structure comprises a radio wave absorption body attached to an outer side thereof.

11. The system of claim 1, wherein each of the plurality of probes has a beam width decided by the following mathematical formula:

$$\theta = 2\tan^{-1}\left(\frac{D/2}{R}\right)$$

where D represents a size of the radio wave device, and R represents an arch radius of the arch structure.

12. The system of claim 1, wherein said two conductors are disposed to extend from the feeding points, and to cross each other.

13. The system of claim 1, wherein respective tip parts of said two conductors are located in their respective grooves extending by passing through a center of the main body of the probe.

14. The system of claim 1, wherein the plurality of probes are grouped to correspond to a plurality of channels, respectively, and the plurality of channels correspond to frequency bands which are different from one another, respectively.

* * * * *